United States Patent [19]
Lin et al.

[11] Patent Number: 5,536,683
[45] Date of Patent: Jul. 16, 1996

[54] METHOD FOR INTERCONNECTING SEMICONDUCTOR DEVICES

[75] Inventors: Jeng Ping Lin, Tayuan Village; Sun-Chieh Chien, Hsin-Chu, both of Taiwan

[73] Assignee: United Microelectronics Corporation, Hsin-Chu, Taiwan

[21] Appl. No.: 490,853

[22] Filed: Jun. 15, 1995

[51] Int. Cl.⁶ .................................................. H01L 21/28
[52] U.S. Cl. ........................... 437/200; 437/41; 437/193; 437/186
[58] Field of Search .......................... 437/41, 186, 193, 437/200, 201

[56] References Cited

U.S. PATENT DOCUMENTS

| | | | |
|---|---|---|---|
| 5,053,349 | 10/1991 | Matsuoka | 437/41 |
| 5,124,280 | 6/1992 | Wei et al. | 437/200 |
| 5,162,259 | 11/1992 | Kolar et al. | 437/192 |
| 5,278,098 | 1/1994 | Wei et al. | 437/192 |
| 5,302,539 | 4/1994 | Haken et al. | 437/200 |
| 5,326,713 | 7/1994 | Lee | 437/186 |
| 5,346,860 | 9/1994 | Wei | 437/200 |
| 5,444,285 | 8/1995 | Robinson et al. | 437/186 |

*Primary Examiner*—George Fourson
*Assistant Examiner*—Thomas G. Bilodeau
*Attorney, Agent, or Firm*—William H. Wright

[57] ABSTRACT

A method for forming an interconnect structure within a semiconductor device. An isolation region which defines an active region is formed upon a semiconductor substrate. A gate electrode is formed upon the active region and an interconnect is formed partially upon the active region and partially upon the isolation region. A low dose ion implant is then provided into the active region not covered by the gate or the interconnect. A pair of insulator spacers are then formed at opposite edges of the gate. A source/drain electrode is then formed within the active region between the gate electrode and the interconnect, and a second source/drain electrode is formed within the active region between the isolation region and the gate. Finally, a metal silicide layer is formed bridging adjoining surfaces of the interconnect and the first source/drain electrode. In a second embodiment, the source/drain electrodes are formed after the metal silicide layer.

22 Claims, 5 Drawing Sheets

METHOD FOR INTERCONNECTING SEMICONDUCTOR DEVICES

BACKGROUND OF THE INVENTION

1. 1 Field of the Invention

The present invention relates generally to methods for forming interconnect structures within integrated circuit devices. More particularly, the present invention relates to a method for forming a direct connection between an interconnect structure formed within an integrated circuit and the surface of an active semiconductor substrate region immediately adjoining that interconnect structure.

2. Description of the Prior Art

The overall performance or a semiconductor integrated circuit device chip is defined primarily by two factors. The first factor is the performance characteristics of the individual transistors and other circuit elements which are formed within and upon the semiconductor substrate from which the integrated circuit device chip is formed. The performance of these circuit elements is defined largely by the design parameters to which the circuit elements must be fabricated and the limitations of the fabrication tooling and processes used to achieve those design parameters.

The second factor which significantly affects semiconductor integrated circuit device chip performance is the characteristics of the conductors which are used to interconnect the circuit elements within the semiconductor integrated circuit device chip. In general the performance or the conductors deteriorates as: (1) they become longer in length, (2) they adjoin other conductors from which they may sustain parasitic effects, and (3) they terminate in highly resistive connections to contact regions of semiconductor integrated circuit device elements.

Thus, as the packing density and performance requirements for advanced generations of integrated circuit device chips increases, it is important to consider the performance requirements of both the individual circuit elements within the integrated circuit device chip and the methods by which the individual circuit elements are interconnected. Consideration of both of these factors will optimally assure the desired levels of overall chip performance.

Traditionally, interconnections between transistor devices and other circuit elements contained within semiconductor integrated circuit chips have been made through the use of patterned metallization connection lines defined upon the surface of the semiconductor substrate within which the integrated circuit elements are formed. The patterned metal lines are typically isolated from each other and separated from the semiconductor substrate by intermetallic and interlevel dielectric layers formed upon the semiconductor substrate from materials such as silicon oxide and silicon nitride. While these traditional interconnection methods have served well in providing adequate interconnections for traditional semiconductor integrated circuit device chips, they ten provide inadequate performance for advanced and evolving generations of integrated circuit device chips.

Thus, to the end of sustaining advances in semiconductor integrated circuit device chip performance, several novel interconnection technologies and materials have evolved which are directed towards enhancing the performance of conductive interconnections within semiconductor integrated circuit chips. These technologies and materials include: (1) the use of direct polysilicon interconnects with buried contacts to doped semiconductor device contact regions in order to limit parasitic losses due to longer interconnection schemes formed from metal lines, (2) the use of self-aligned contact technology for avoiding increased contact resistance due to mis-registration, and (3) the use of silicide barrier layers which reduce conductor contact resistance and metal penetration into semiconductor device and circuit element contact regions.

While all of the above technologies and materials are pertinent to the present invention, their application is best understood within the context of the use of interconnect structures within semiconductor integrated circuit device chips. Interconnect structures are typically formed upon the surface of an isolation region which separates active regions within an integrated circuit chip. Interconnects have several applications within semiconductor device technology. For example, they may be used to interconnect contact regions of adjoining integrated circuit device elements which are separated by the isolation region upon which the interconnect is formed. Alternatively, they may be used to bring to the surface of the isolation region a contact to an integrated circuit element which would otherwise be located to close to an adjoining contact.

The design and methods of fabrication of interconnect structures are known in the art. For example, Matsuoka, in U.S. Pat. No. 5,053,349 teaches a method for interconnecting semiconductor devices which includes forming a titanium silicide or tungsten metal bridge between the adjoining surfaces of a polysilicon interconnect and a source/drain electrode of a field effect transistor. In particular, the disclosure describes prior art problems which include: (1) the interdiffusion of dopants which occurs through direct contact between a doped polysilicon interconnect structure and an active semiconductor region of differing conductivity type, and (2) the formation of ditches within semiconductor substrates when polysilicon interconnects are formed upon those surfaces in the absence of an adequate etch stop barrier.

Figure 1A:
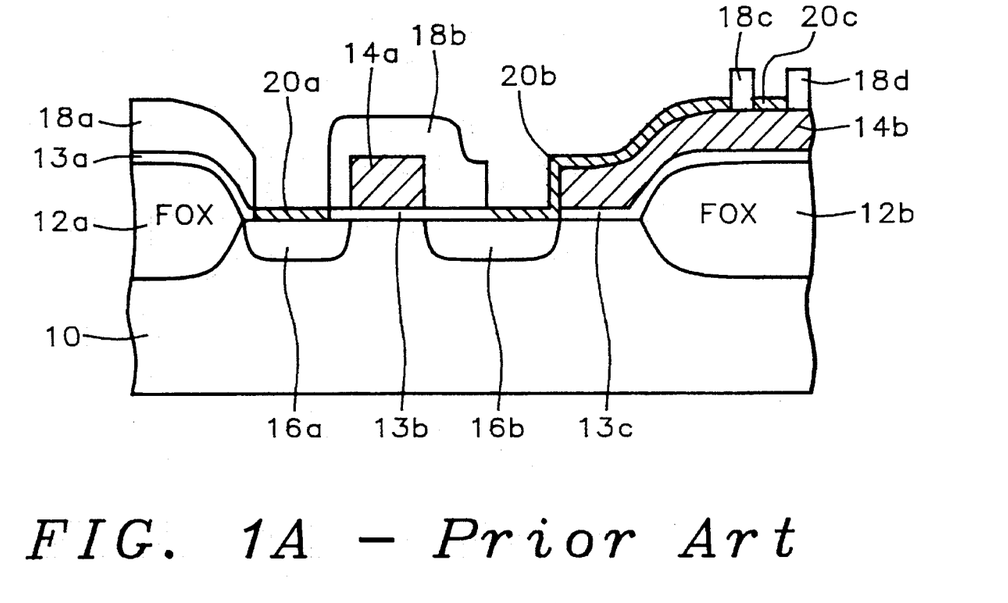
FIG. 1a and FIG. 1b show cross-sectional schematic diagrams of semiconductor device structures having formed therein interconnect structures of the prior art.

The structure disclosed by Matsuoka is shown in FIG. 1a. In FIG. 1a, a semiconductor substrate 10 has formed therein an active region defined by isolation regions 12a and 12b. Formed upon the active region is a polysilicon gate electrode 14a upon a gate oxide 13b. Formed partially upon the active region and partially upon the isolation region 12b is a polysilicon interconnect 14b upon a gate oxide 13c. The isolation region 12a, the gate electrode 14a and the interconnect 14b define a pair of source/drain electrodes 16a and 16b. Insulating layers 18a, 18b, 18c and 18d define silicon surfaces upon which are formed conductive layers 20a, 20b and 20c. The conductive layers are formed of either tungsten metal or titanium silicide. Conductive layer 20b provides a bridge between interconnect 14b and source/drain electrode 16b. Within this structure the source/drain electrodes 16a and 16b are formed prior to the insulating layers 18a, 18b, 18c and 18d.

Another example of an interconnect structure is disclosed by Wei, in U.S. Pat. No. 5,346,860. In comparison with Matsuoka, Wei discloses a multi-layer structure for forming a silicide interconnect between an active semiconductor substrate region and a conductor formed remotely upon an oxide isolation region adjoining the active semiconductor substrate region. Similar to the interconnect structure taught by Matsuoka, the interconnect structure disclosed by Wei is also directed to limiting outdiffusion of dopants from active semiconductor substrate regions upon which the interconnect is formed. In addition, the disclosure of Wei is also directed to forming an interconnect which consumes a limited amount of silicon from the surface of the silicon semiconductor substrate upon which the interconnect is formed.

Figure 1B:
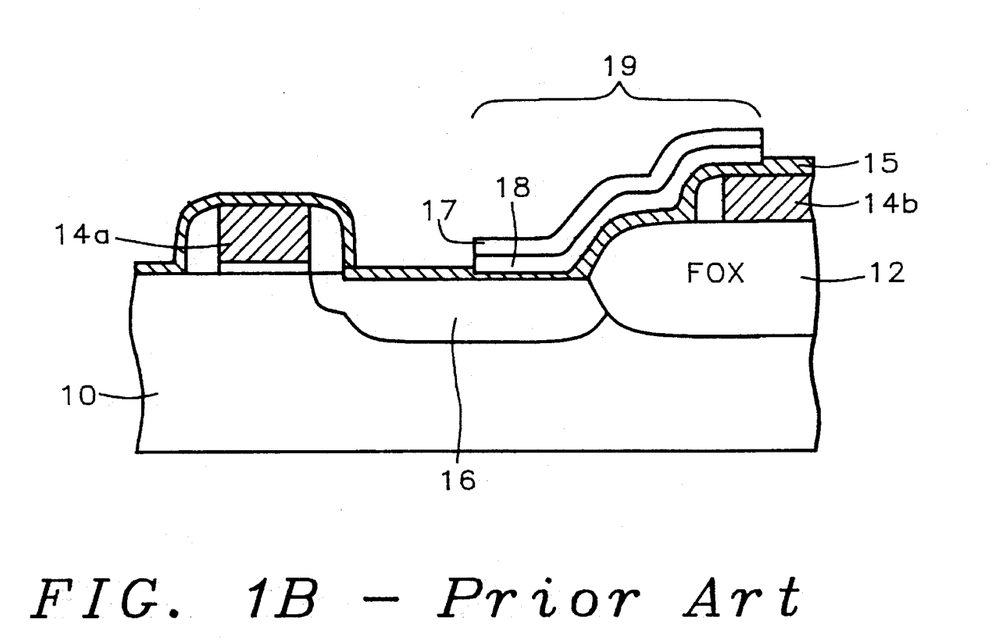

The interconnect disclosed by Wei is shown in FIG. 1b. in FIG. 1b there is shown a semiconductor substrate 10 having an active region adjoining an isolation region 12. A polysilicon gate electrode 14a and a polysilicon conductor 14b are formed respectively upon remote locations of the active region and the isolation region 12. A source/drain electrode 16 is formed within the semiconductor substrate 10 between the polysilicon gate 14a and the isolation region 12. A metal layer 15 is formed on the surfaces of the polysilicon gate electrode 14a, the source/drain electrode 16, the isolation region 12 and the polysilicon conductor 14b. After a self-aligned silicidation process, the portion of the metal layer 15 which resides beneath structure 19 forms a silicide interconnect bridging the source/drain electrode 16 and the polysilicon conductor 14b. Structure 19 is formed from an oxide insulating layer 17 formed over an amorphous silicon layer 18.

Not disclosed are methods and materials which extend the prior art of interconnect structures having metal or metal silicide layers which bridge to active semiconductor substrate regions immediately adjoining those interconnect structures. Nor are there disclosed in the prior art alternate semiconductor process methodologies which: (1) are more compatible with the Lightly Doped Drain (LDD) type transistor formation process and conventional self-aligned silicidation processes, and (2) maintain the integrity of critical functions within semiconductor devices to which an interconnect is formed.

SUMMARY OF THE INVENTION

A first object of the present invention is to provide a readily manufacturable method for forming an interconnect to an active semiconductor substrate region, which method is more compatible with both the Lightly Doped Drain (LDD) type transistor formation process and the conventional self-aligned silicidation process.

A second object of the present invention is to provide a method for forming an interconnect structure in accord with the first object of the present invention, which method does not compromise the integrity of critical semiconductor junctions formed within active semiconductor substrate regions to which the interconnect is connected.

In accord with the objects of the present invention, a new method for forming an interconnect structure within an integrated circuit device is described. In a first embodiment of the method, an isolation region is formed upon a semiconductor substrate, which isolation region defines an active region within the semiconductor substrate. A gate oxide is then formed upon the active region. A gate electrode is then formed upon the gate oxide, and an interconnect is formed partially upon the gate oxide and partially upon the isolation region. A low dose ion implant is then provided into the active region at areas not covered by the gate electrode and the interconnect. A pair of insulator spacers is then formed upon the active region at the edges of the gate. A first source/drain electrode is then formed within the active region between the interconnect and the gate electrode, and a second source/drain electrode is formed within the active region between the isolation region and the gate electrode. Finally, a metal silicide layer is formed bridging the adjoining surfaces of the interconnect and the first source/drain electrode.

In a second embodiment, an isolation region is formed upon a semiconductor substrate, which isolation region defines an active region within the semiconductor substrate. A gate oxide is then formed over the active region. A gate electrode is then formed upon the gate oxide, and an interconnect is formed partially upon the gate oxide and partially upon the isolation region. A low dose ion implant is then provided into the active region at areas not covered by the gate electrode and the interconnect. An insulating layer is then formed over the semiconductor substrate, the insulating layer having an opening formed therethrough exposing a portion of the interconnect and an adjoining portion of the active region. A metal silicide layer is then formed bridging the adjoining surfaces of the interconnect and the active region exposed through the opening in the insulating layer. The insulating layer is then etched to leave remaining a pair of insulator spacers at opposite edges of the gate. Finally, there are formed a first source/drain electrode within the active region between the interconnect and the gate electrode, and a second source/drain electrode within the active region between the isolation region and the gate electrode.

The interconnect structure formed in accord with the first embodiment solves the problems of: (1) connecting a doped polysilicon interconnect structure and an active semiconductor region of differing conductivity types, and (2) formation of ditches in semiconductor substrates, both of which problems are known from the prior art. Furthermore, the interconnect structure formed in accord with the first embodiment can be formed through a simpler process which is more compatible with the formation of a Lightly Doped Drain (LDD) type transistor structure having a pair of insulator spacers at opposite edges of the gate electrode of a field effect transistor. The interconnect structure of the second embodiment provides further reduced susceptibility to outdiffusion of dopants since the source/drain electrodes of the second embodiment are formed after the bridging layer is formed from the interconnect to the active region of the semiconductor substrate.

The interconnects formed in accord with the second embodiment also do not compromise critical semiconductor junctions within active semiconductor substrate regions to which those interconnects are connected. In silicide formation processes practiced upon heavily doped field effect transistor source/drain electrodes within active semiconductor substrate regions large amounts of silicon are consumed from those heavily doped source/drain electrodes. Thus, source/drain electrodes of field effect transistors of the prior art are susceptible to complete penetration by portions of silicide layers since the silicide layer-semiconductor substrate interface is very close to the source/drain electrode junction formed within the semiconductor substrate. The integrity of the critical semiconductor junction in the second embodiment is maintained because the high dose ion implants are implanted into the active semiconductor substrate region to form source/drain electrodes after the metal silicide bridging layer is formed.

DESCRIPTION OF THE PREFERRED EMBODIMENTS

The preferred embodiments of the present invention are shown in FIG. 2a to FIG. 2d and FIG. 3a to FIG. 3d. Consistent with the prior art, the preferred embodiments of the present invention provide methods for connecting an interconnect structure formed upon a semiconductor substrate to an adjoining active region within the semiconductor substrate regardless of the conductivity type of the interconnect and the active region. The methods of the present invention control interdiffusion of dopants from the interconnect to the active semiconductor substrate region to which the interconnect is connected through the use of low back-end processing temperatures. The present invention can also avoid the formation of ditches in silicon semiconductor substrates as is known in the prior art.

In contrast to the prior art, the present invention provides methods for connecting an interconnect to an adjoining highly doped active semiconductor substrate region, which methods provide simpler processes which are more compatible with conventional Lightly Doped Drain (LDD) field effect transistor fabrication processes. In contrast to the prior art, the present invention provides methods for connecting an interconnect to an adjoining highly doped active semiconductor substrate region while maintaining, in spite of temperature excursions, critical semiconductor junctions associated with the highly doped active semiconductor substrate region. In contrast to the prior art, the present invention also provides a wider array of methods and materials from which interconnect structures and connections to those structures may be formed.

The interconnect structure formed in accord with the present invention may be used in connecting active doped contact regions of various integrated circuit devices and integrated circuit elements. The circuit device and circuit element contacts to which connections from the interconnect of the present invention may be made include, but are not limited to resistor contacts, diode contacts and transistor contacts of all types. The method of the present invention provides a bridging connection between an interconnect and an active semiconductor substrate contact region of many types.

Referring now to FIG. 2a to FIG. 2d there is shown a series of cross-sectional schematic diagrams which illustrate a semiconductor device structure at progressive stages of processing in accord with the first preferred embodiment of the present invention. In comparison with the prior art, the first preferred embodiment of the present invention provides a low dose ion implant into the active semiconductor substrate region to which a connection from an interconnect is made. The low dose ion implant defines a junction within the active semiconductor substrate region which has limited susceptibility to diffusion upon subsequent temperature excursions. In addition, the first preferred embodiment provides a wider array of materials than is known in the art for forming interconnect structures and bridging layers between those interconnect structures and adjoining active semiconductor substrate regions to which those interconnect structures connect.

Figure 2A:
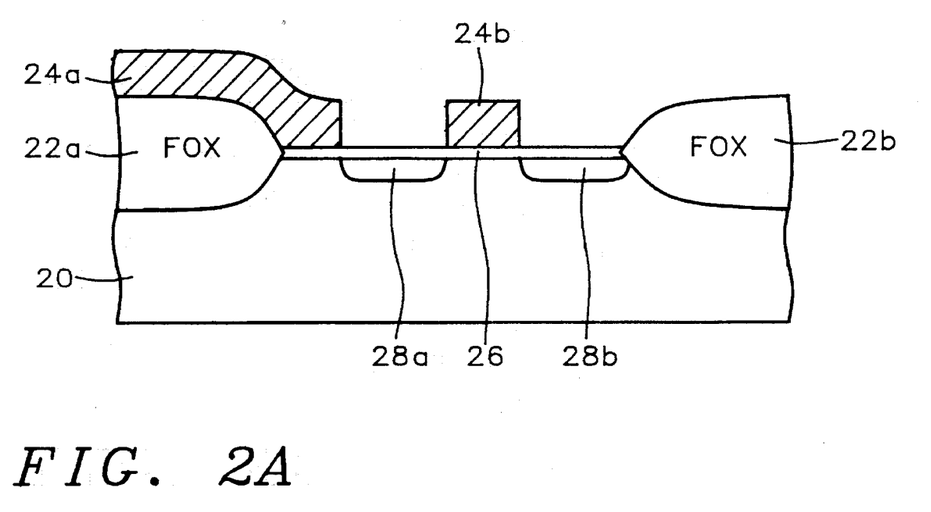
FIG. 2a to FIG. 2d show a series of cross-sectional schematic diagrams corresponding to semiconductor device structures at various stages of processing in accord with the first preferred embodiment of the present invention.

Referring now to FIG. 2a, there is shown a cross-sectional schematic diagram of a field effect transistor at the early steps in processing of the method of the first preferred embodiment of the present invention. Shown in FIG. 2a is a semiconductor substrate 20 into which are formed isolation regions 22a and 22b which define an active region within the semiconductor substrate 20. Typically, the semiconductor substrate 20 will be a P− doped silicon wafer having a (100) crystallographic orientation. The isolation regions 22a and 22b are typically silicon oxide regions formed through thermal oxidation of the surface of the semiconductor substrate 20.

Subsequent to forming the isolation regions 22a and 22b, a gate oxide 26 is formed upon the surface of the active region defined by the isolation regions 22a and 22b. Methods for forming gate oxides are well known in the art. Such methods include but are not limited to thermal methods which oxidize the surface of the active region, as well as Chemical Vapor Deposition (CVD) methods which form gate oxides through chemical oxidation of silicon oxide precursor materials. For the present invention, the gate oxide 26 is preferably formed through a thermal oxidation process at about 850 degrees centigrade to yield a typical gate oxide 26 thickness of about 70 to about 150 angstroms upon the semiconductor substrate 20.

Also shown in FIG. 2a are the gate electrode 24b and the interconnect 24a. Gate electrodes and interconnects may be formed simultaneously from several materials as are known in the art. Such materials include, but are not limited to metals, polycides and polysilicon. Polycides are materials formed from alternating silicide/polysilicon stacks. The gate electrode 24b and the interconnect 24a of the present invention are preferably formed simultaneously through patterning of a doped polysilicon layer or a doped polycide layer formed upon the surfaces of the gate oxide 26 and the isolation regions 22a and 22b. Most preferably, the gate electrode 24b and the interconnect 24a are formed from a doped polysilicon layer. The doped polysilicon layer is preferably about 2000 to about 4000 angstroms thick.

The doped polysilicon layer may be formed through several methods as are known in the art. The doped polysilicon layer may be formed through implanting ions into an undoped polysilicon layer, or the doped polysilicon layer may be formed through codeposition of dopants with the polysilicon layer. For the present invention, the doped polysilicon layer is preferably formed through depositing an undoped polysilicon through a Low Pressure Chemical Vapor Deposition (LPCVD) process and subsequently implanting the layer with phosphorus ions. The doped polysilicon layer is subsequently patterned, preferably through a Reactive Ion Etch (RIE) process as is known in the art, to form the gate electrode 24b and interconnect 24a of the present invention. The gate oxide layer 26 over which the doped polysilicon layer was formed serves as an etch stop barrier when patterning the polysilicon layer into the gate electrode 24b and the interconnect 24a.

Finally, also shown in FIG. 2a are the low dose ion implants 28a and 28b which are formed within the semiconductor substrate 20 at regions adjoining the interconnect 24a, the gate electrode 24b and the isolation region 22b. Although low dose ion implants 28a and 28b may be formed from either N− dopants or P− dopants, the preferred dopant for the present invention is a N− dopant, since the preferred substrate for the present invention is a P− substrate. Of the choices for N− dopant, it is preferred for the present invention to form the low dose ion implants 28a and 28b with phosphorus ion implanted at about 1E13 to about 5E13 ions per square centimeter implantation dose and about 30 to about 60 keV ion implantation energy.

Figure 2B:
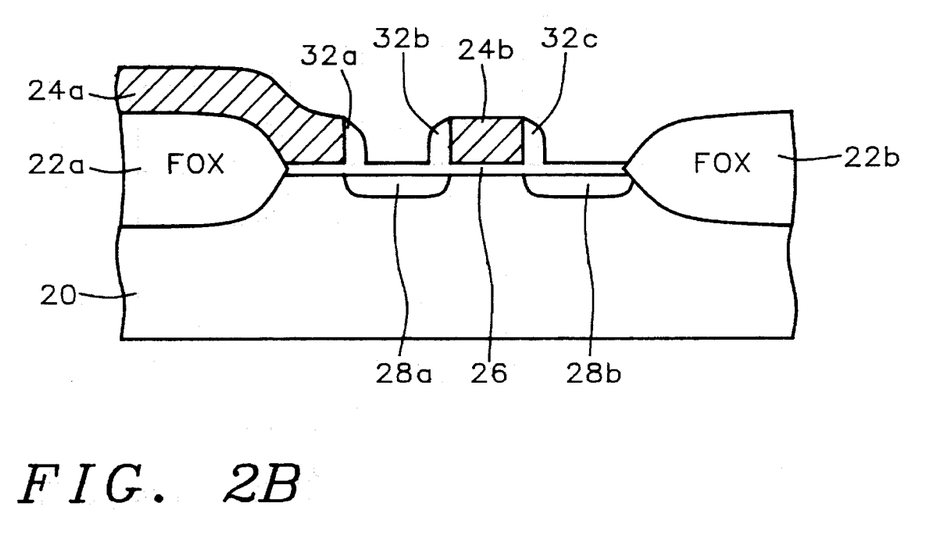

Referring now to FIG. 2b, there is shown a schematic cross-sectional diagram illustrating a semiconductor substrate in accord with the next series of process steps of the first preferred embodiment of the present invention. FIG. 2b shows the formation of a series of insulator spacers 32a, 32b and 32c at the edges of the gate electrode 24b and the interconnect 24a. The insulator spacers 32a, 32b and 32c are formed through etching of an insulator layer which is deposited over the semiconductor structure shown in FIG. 2a. The material from which the insulator spacers 32a, 32b and 32c are formed is preferably either silicon oxide or silicon nitride. Most preferably, the insulator spacers 32a, 32b and 32c are formed from a layer of silicon oxide which silicon oxide layer was formed at a thickness of about 1000 to about 2000 angstroms on the semiconductor substrate 20. The silicon oxide layer is then etched, preferably through a Reactive Ion Etch (RIE) process as is conventional in the art to yield the insulator spacers 32a, 32b and 32c shown in FIG. 2b.

Figure 2C:
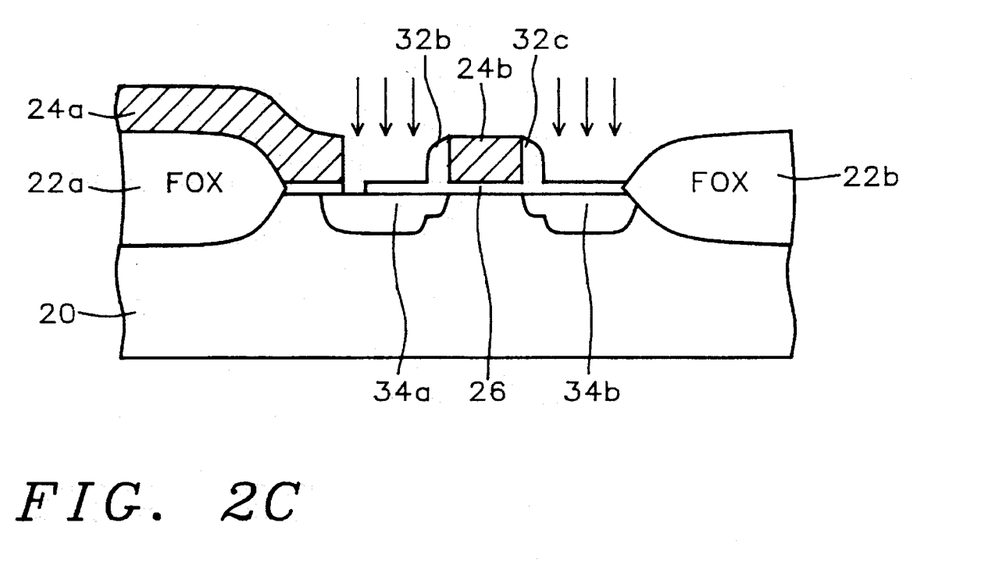

Referring now to FIG. 2c there is shown a schematic cross-sectional diagram illustrating a semiconductor substrate in accord with the next series of process steps of the first preferred embodiment of the present invention. Absent from FIG. 2c is the insulator spacer 32a which adjoined the interconnect 24a of FIG. 2b. Insulator spacer 32a is removed through an etching process after masking the insulator spacers 32b and 32c which remain adjoining the gate electrode 24b. Several etch methods may be used to remove the insulator spacer 32a. Such etch methods include, but not limited to wet chemical etch methods, Reactive Ion Etch (RIE) methods and energetically assisted RIE methods. It is preferred to remove insulator spacer 32a completely from the adjoining surfaces or the interconnect 24a and the semiconductor substrate 20 through a wet chemical etch process. The wet chemical etch process is preferably performed by immersing the wafers in a 10:1 deionized water:hydrofluoric acid solution for a period of about 1 to about 3 minutes.

After removing the insulator spacer 32a, the source/drain electrodes 34a and 34b are formed within the semiconductor substrate 20 using methods as are conventional in the art. Although the source/drain electrodes 34a and 34b may be formed of either N+ or P+ polarity, the choice of polarity for the semiconductor substrate 20 and the low dose ion implants 28a and 28b will dictate the polarity or the source/drain electrodes 34a and 34b. Since the preferred semiconductor substrate 20 for the present invention is P− polarity, the preferred polarity of the source/drain electrodes 34a and 34b is N+. N+ source/drain electrodes 34a and 34b may be formed through either phosphorus or arsenic doping. Preferably, the N+ source/drain electrodes 34a and 34b or the present invention are formed through arsenic doping via ion implantation at about 1E15 to about 5E15 ions per square centimeter dose and about 40 to about 80 keV ion implantation energy. Subsequent to implanting with arsenic ion, the source/drain electrodes 34a and 34b are annealed at about 800 to about 900 degrees centigrade for about 30 to about 60 minutes. Although it is preferred for the first embodiment of the present invention that the source/drain electrodes 34a and 34b are formed prior to forming a metal silicide layer over the surfaces of those electrodes, it is also possible in the first preferred embodiment or the present invention that the source/drain electrodes 34a and 34b may be formed after the metal silicide layer is formed.

Figure 2D:
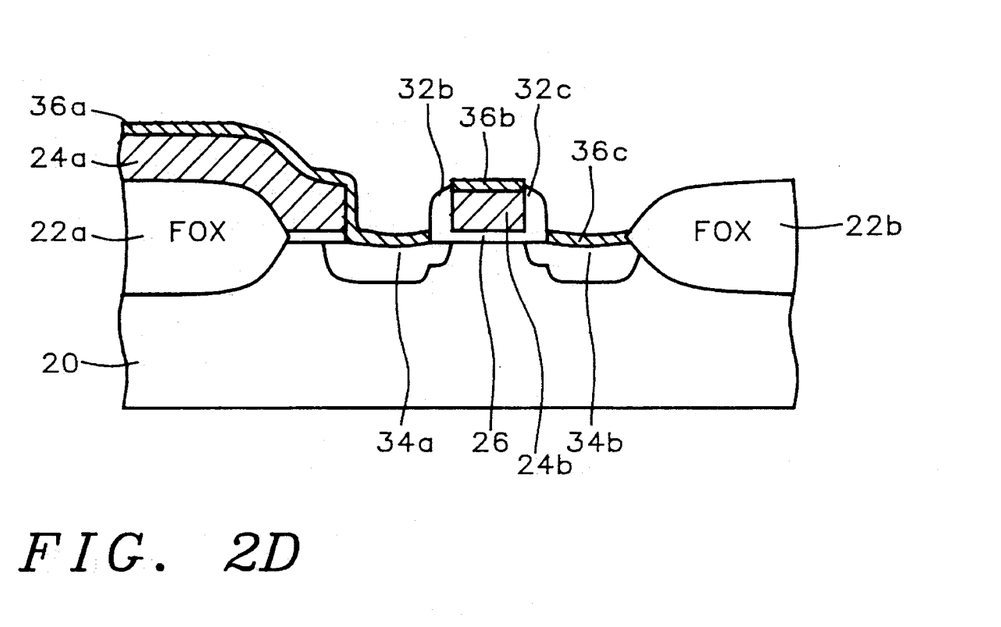

Referring now to FIG. 2d, there is shown a schematic cross-sectional diagram illustrating a semiconductor substrate in accord with the last series of process steps of the first preferred embodiment of the present invention. FIG. 2d shows a series of silicide layers 35a, 36b and 36c formed upon silicon surfaces of the field effect transistor structure formed within and upon the semiconductor substrate 20. Silicide layer 36a forms a bridge between source/drain electrode 34a and interconnect 24a. Silicide layer 30b is formed upon the top surface of the gate electrode 24b and silicide layer 36c is formed upon the surface of the source/drain electrode 34b.

in order to form the silicide layers 36a, 36b and 36c, the surface of the semiconductor structure shown in FIG. 2c is first etched slightly with diluted hydrofluoric acid to remove the native oxide. The preferred etching conditions are exposure of the semiconductor substrate 20 to a 100:1 aqueous hydrofluoric acid solution for about 2 to about 5 minutes at a temperature of about 25 to about 40 degrees centigrade. After the semiconductor substrate 20 has been etched, a silicide forming refractory metal layer is formed non-selectively over the semiconductor substrate 20. Upon heating, the silicide forming refractory metal layer forms a metal silicide with silicon surfaces with which it contacts. For the first embodiment of the present invention, the resulting silicide layers are shown as silicide layers 36a, 36b and 36c. Unreacted portions or the metal layer which was deposited upon non-silicon surfaces may be removed through an etchant appropriate for the metal.

Of the refractory and near nobel metals known in the art to form silicide layers with silicon surfaces with which they contact, it is preferred that silicide forming metal layer for the present invention be formed from a metal chosen from the group consisting of consisting of titanium, tungsten, cobalt and tantalum. It is most preferred that the silicide forming metal layer be formed from titanium.

To form the silicide layer, a titanium layer is preferably formed upon the native oxide free silicon surface. In order to form titanium silicide, the semiconductor substrate 20 having formed the titanium layer thereon is heated, preferably to a temperature of about 600 to about 700 degrees centigrade for a time period of about 1 to about 10 minutes. The remaining unreacted titanium layer and any titanium oxynitride formed from the reaction process may then be removed through etching by exposure to an alkaline aqueous etch solution comprising about 1 part by volume ammonium hydroxide, about 1 part by volume hydrogen peroxide and about 5 parts by volume deionized water. After removing the unreacted titanium metal layer and any titanium oxynitride, the titanium silicide layers 30a, 36b and 36c remaining upon the semiconductor substrate 20 are annealed at a temperature of about 700 to about 800 degrees centigrade for a time period of about 10 to about 30 minutes. After the annealing process, there is formed the field effect transistor structure of the first preferred embodiment of the present invention. The field effect transistor structure possesses the silicide layer 36a which bridges the surfaces of the interconnect 24a and the source/drain electrode 34a.

Referring now to FIG. 3a to FIG. 3d, there is shown a series of cross-sectional schematic diagrams of a semiconductor substrate which illustrate the second preferred embodiment of the present invention. Two features differentiate the second preferred embodiment from the first preferred embodiment. The first feature is the number and size of silicide layers that are formed upon the semiconductor substrate. For the second preferred embodiment of the present invention, a single localized silicide layer is formed which bridges localized surfaces of the interconnect and the source/drain electrode immediately adjoining the interconnect.

The second feature is the point in the processing of the semiconductor substrate at which the source/drain electrodes are formed into the semiconductor substrate. In the second preferred embodiment of the present invention, the source/drain electrodes are formed after the silicide layer has been formed.

Figure 3A:
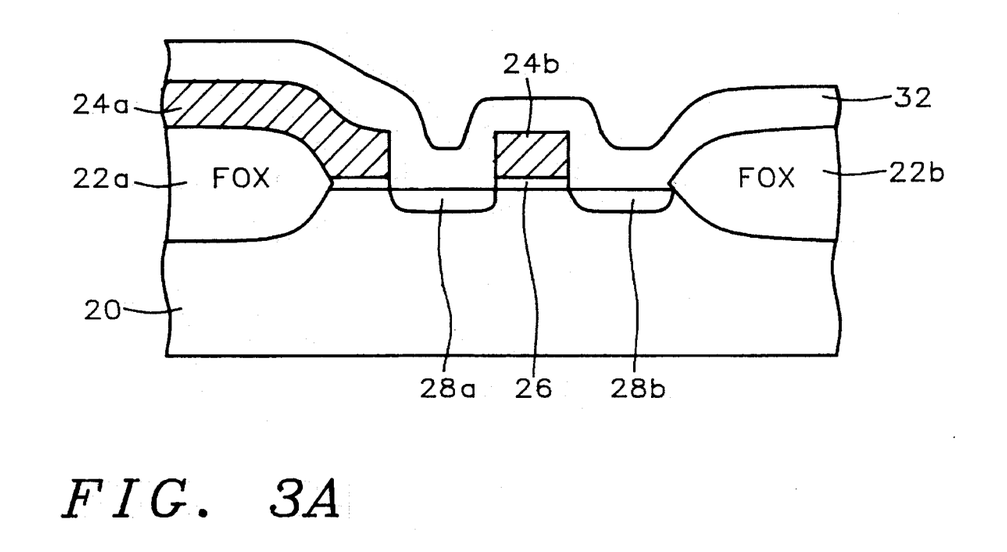
FIG. 3a to FIG. 3d show a series of cross-sectional schematic diagrams corresponding to semiconductor device structures at various stages of processing in accord with the second preferred embodiment of the present invention.

Referring now to FIG. 3a, there is shown a schematic cross-sectional diagram which illustrates the first series of process steps in accord with the second preferred embodiment of the present invention. FIG. 3a shows a field effect transistor structure similar to that shown in FIG. 2a with the exception that an insulating layer 32 has been formed over the surface of the field effect transistor structure. The insulating layer 32 is formed in accord with the parameters described for the first preferred embodiment of the present invention. Preferably, the insulating layer 32 is formed from a silicon oxide material or a silicon nitride material. Most preferably, the insulating layer 36 is formed from a Chemical Vapor Deposited (CVD) silicon oxide material formed at about 1000 to about 2000 angstroms.

Analogously to FIG. 2a, FIG. 3a shows low dose ion implants 28a and 28b. Similarly to FIG. 2a, these low dose ion implants are provided into the semiconductor substrate 20 at about 1E13 to about 5E13 ions per square centimeter dose and about 30 to about 60 keV ion implantation energy.

Figure 3B:
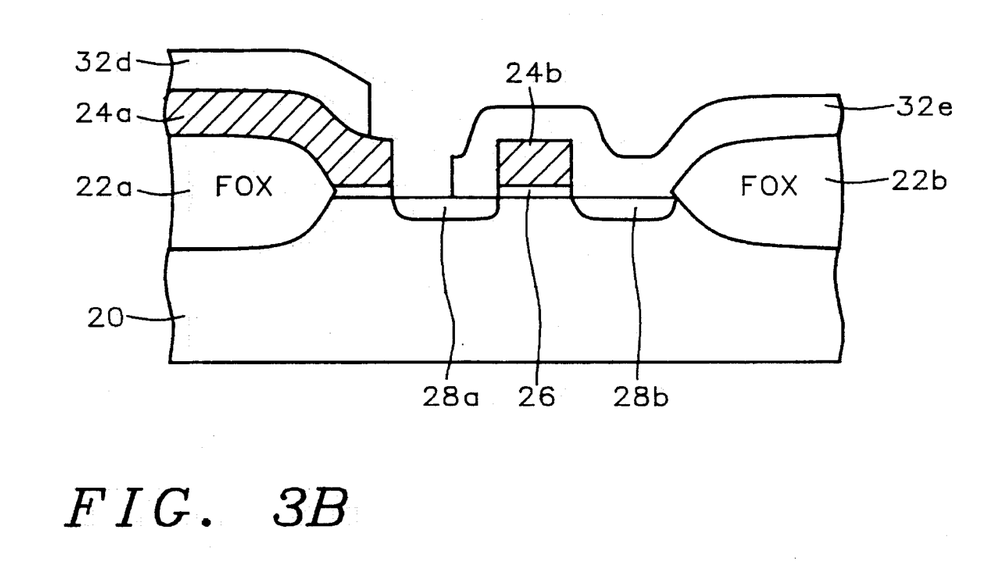

Referring now to FIG. 3b there is shown a schematic cross-sectional diagram which illustrates the next series of process steps in accord with the second preferred embodiment of the present invention. FIG. 3b shows an opening etched through the insulating layer 32 of FIG. 3a to form insulating layers 32d and 32e which leave exposed a portion of the interconnect 24a and an immediately adjoining portion of the semiconductor substrate 20 at the location of the low dose ion implant 28a. In contrast with the first preferred embodiment, etching of the opening through the insulating layer 32 is preferably accomplished through a wet chemical process using an appropriate photomask and 10:1 Buffered Oxide Etchant (BOE) as the etchant.

Figure 3C:
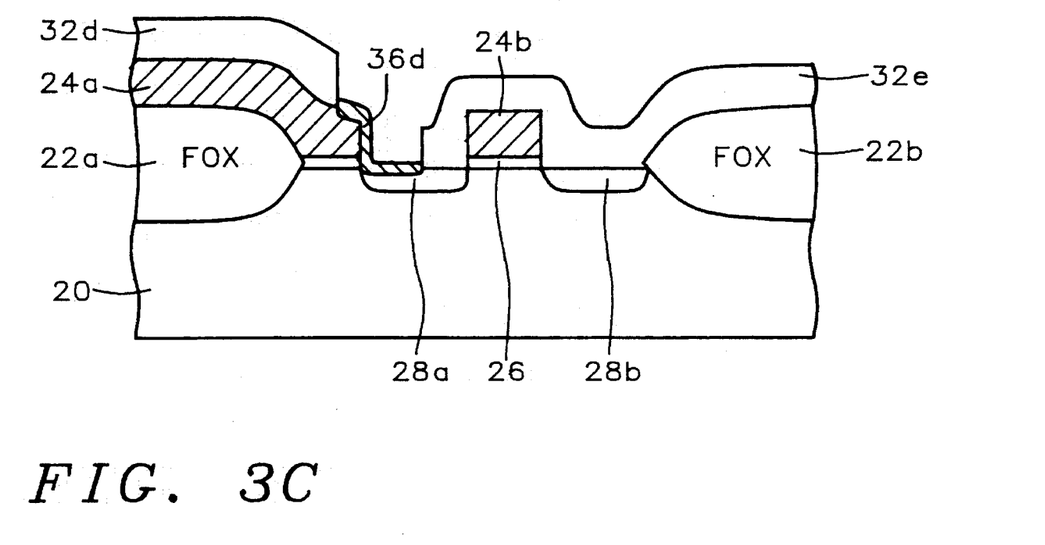

Referring now to FIG. 3c there is shown a schematic cross-sectional diagram which illustrates the next process step in accord with the second preferred embodiment of the present invention. FIG. 2c illustrates the formation of silicide layer 36d which bridges from the exposed surfaces of the interconnect 24a to the exposed surface of the semiconductor substrate 20 at the location of the low dose ion implant 28a. In comparison with the first preferred embodiment, the silicide layer 36d bridges smaller portions of the interconnect 24a and the semiconductor substrate 20.

Silicide layer 36d is preferably formed through the same process by which are formed the silicide layers 36a, 36b and 36c of the first embodiment. Specifically, the silicide layer 36d is preferably formed through heat treatment of a refractory metal layer formed non-selectively over the semiconductor substrate. Also consistent with the first embodiment, silicide layer 36d is preferably formed from a metal silicide where the metal is chosen from the group of metals consisting of titanium, cobalt, tungsten and tantalum. Most preferably, the silicide layer 36d is formed through heat treatment of a titanium layer which is formed upon the surface or the semiconductor substrate 20. Upon heating, the portion or the titanium layer which contacts the exposed surfaces or the interconnect 24a and the semiconductor substrate 20 will form silicide layer 36d. The remaining unreacted titanium metal and any titanium oxynitride formed within this layer may be removed through a chemical etch process in accord with the first preferred embodiment.

Figure 3D:
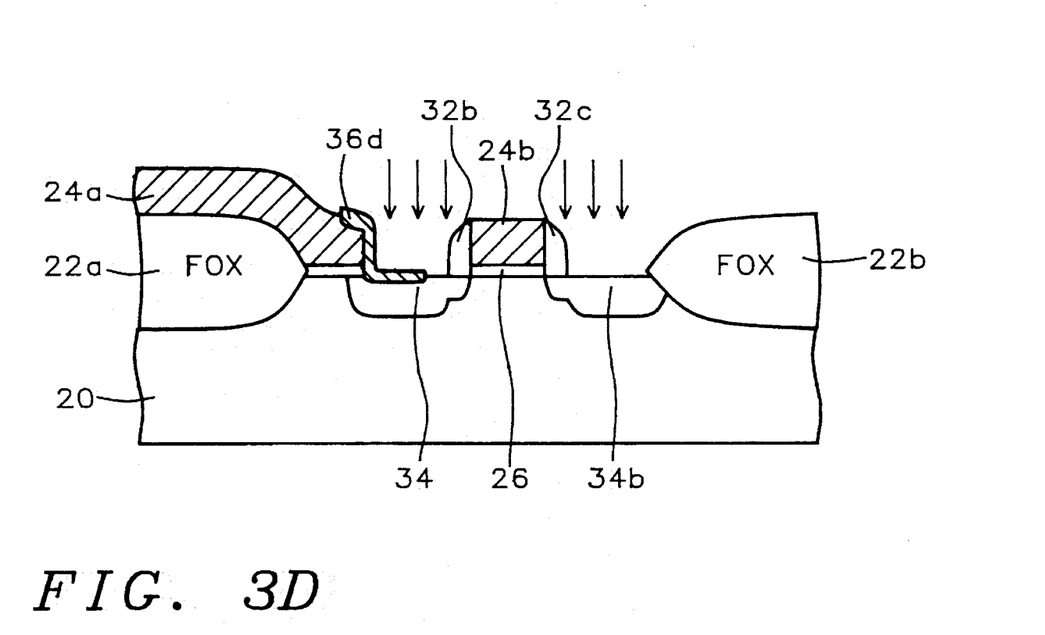

Referring now to FIG. 3d there is shown a cross-sectional schematic diagram illustrating a semiconductor substrate in accord with the last series of process steps of the second preferred embodiment of the present invention. Shown in FIG. 3d is a field effect transistor structure formed from the structure illustrated in FIG. 3c after: (1) the remaining portions of the insulating layer 32 have been etched to form insulator spacers 32b and 32c, and (2) the source/drain electrodes 34a and 34b have been formed.

Similarly to the first preferred embodiment of the present invention, the insulator spacers 32b and 32c are formed through an anisotropic Reactive Ion Etch (RIE) process using an etchant gas appropriate to the insulating material.

Finally, the last step in the second preferred embodiment of the present invention is forming the source/drain electrodes 34a and 34b. The source/drain electrodes 34a and 34b are formed through a process similar to the first preferred embodiment of the present invention. The preferred dopant for forming the source/drain electrodes 34a and 34b is arsenic ion, which is implanted at about 1E15 to about 5E15 ions per square centimeter ion implantation dose and about 40 to about 80 keV ion implantation energy. The source/drain electrodes 34a and 34b are then annealed, preferably at a temperature of about 800 to about 900 degrees centigrade for a time period of about 30 to about 60 minutes. During this annealing process, the arsenic dopant atoms are driven out of the silicide layer 36d into the semiconductor substrate 20 to form the source/drain electrode 34a.

Although it is not preferred, the source/drain electrodes 34a and 34b of preferred polarity may also be formed through implanting phosphorus ions. It is also possible to form source/drain electrodes 34a and 34b of opposite polarity through implanting boron dopant ions. In so doing, the low dose ion implants 28a and 28b and the semiconductor substrate 20 must be of opposite polarity to their preferred embodiments. Unfortunately, it is known in the art that boron ions when implanted into a titanium silicide layer will not outdiffuse. Thus, in order to form source/drain electrodes 34a and 34b through a boron ion implant, it will be necessary to either: (1) use a high ion implant energy to implant the boron ions through the silicide layer 36d formed from a titanium silicide, or (2) choose a metal which will form a silicide layer 36d from which implanted boron ions will diffuse.

It is also clear from the second preferred embodiment of the present invention that silicide layers may also be formed upon the surfaces of the gate electrode 24b and the source/drain electrode 34b in a fashion analogous to the method used in the first preferred embodiment of the present invention. The important feature of the second preferred embodiment of the present invention is that the source/drain electrodes 34a and 34b are formed through a high dose ion implant after the silicide layer 36d has been formed bridging adjoining exposed surfaces of the interconnect 24a and the source/drain electrode 34a. The ordering of process steps of the second preferred embodiment, in conjunction with the use of low dose ion implants 28a and 28b, provides a semiconductor device structure wherein critical semiconductor junctions within active semiconductor substrate regions into which have been implanted high doses of ion implant dopants are not susceptible to deterioration.

What is claimed is:

1. A method for forming an interconnect structure within an integrated circuit device comprising:

forming an isolation region upon a semiconductor substrate which defines an active region within the semiconductor substrate;

forming a gate oxide upon the active region;

forming a gale electrode upon the gate oxide, and an interconnect partially upon the gate oxide and partially upon the isolation region;

providing an ion implant into the active region at areas not covered by the gate electrode and the interconnect;

forming a pair ok insulator spacers upon the active region at a pair of opposite edges of the gate electrode;

forming a first source/drain electrode within the active region between the interconnect and the gate electrode, and a second source/drain electrode within the active region between the isolation region and the gate electrode;

forming a metal silicide layer bridging the adjoining surfaces of the interconnect and the first source/drain electrode.

2. The method of claim 1 wherein the gate electrode and the interconnect are formed simultaneously from patterning of a polysilicon layer.

3. The method of claim 1 wherein the gate electrode and the interconnect are formed simultaneously from patterning of a polycide layer.

4. The method of claim 1 wherein the implant is a phosphorus ion implant.

5. The method of claim 4 wherein the phosphorus ion implant is undertaken at about 1E13 to about 5E13 ions per square centimeter implantation dose and about 30 to about 60 keV ion implantation energy.

6. The method of claim 1 wherein the first source/drain electrode and the second source/drain electrode are formed simultaneously through an arsenic ion implant.

7. The method of claim 6 wherein the arsenic ion implant is undertaken at about 1E15 to about 5E15 ions per square centimeter dose and about 40 to about 80 keV ion implantation energy.

8. The method of claim 1 wherein the metal silicide layer is formed from heat treatment of a refractory metal layer formed non-selectively over the semiconductor substrate.

9. The method of claim 8 wherein the refractory metal layer is formed from a metal chosen from the group or metals consisting of titanium, cobalt, tungsten and tantalum.

10. The method of claim 9 wherein the refractory metal layer is formed from titanium.

11. The method of claim 1 further comprising forming a metal silicide layer on the surface of the gate electrode and forming a metal silicide layer on the surface of the second source/drain electrode.

12. The method of claim 1 wherein the pair of insulator spacers is formed from silicon oxide.

13. The method or claim 1 wherein the pair of insulator spacers is formed from silicon nitride.

14. The method of claim 1 wherein the source/drain electrodes are formed after the metal silicide layer is formed.

15. A method for forming an interconnect structure within an integrated circuit device comprising:

forming an Isolation region upon a semiconductor substrate which defines an active region within the semiconductor substrate;

forming a gate oxide over the active region;

forming a gate electrode upon the gate oxide, and an interconnect partially upon the gate oxide and partially upon the isolation region;

providing an ion implant into the active region at areas not covered by the gate electrode and the interconnect;

forming an insulating layer over the semiconductor substrate, the insulating layer having an opening formed therethrough exposing a portion of the interconnect and an adjoining portion of the active region;

forming a metal silicide layer bridging the adjoining surfaces of the interconnect and the active region exposed through the opening in the insulating layer;

etching the insulating layer to leave remaining a pair of insulator spacers at opposite edges of the gate; and forming a first source/drain electrode within the active region between the interconnect and the gale electrode, and a second source/drain electrode within the active region between the isolation region and the gate electrode.

16. The method of claim 15 wherein the ion implant is a phosphorus ion implant provided at about 1E13 to about 5E13 ions per square centimeter dose and about 30 to about 60 KeV ion implantation energy.

17. The method of claim 15 wherein the metal silicide layer is formed from heat treatment of a refractory metal layer formed non-selectively over the semiconductor substrate.

18. The method of claim 17 wherein the refractory metal layer formed from a metal chosen from the group of metals consisting of titanium, cobalt, tungsten and tantalum.

19. The method of claim 18 wherein the refractory metal layer is formed from titanium.

20. The method of claim 15 wherein the first source/drain electrode and the second source/drain electrode are formed simultaneously through an arsenic ion implant at about 1E15 to about 5E15 ions per square centimeter dose and about 40 to about 80 keV ion implantation energy.

21. The method of claim 15 wherein the insulating layer is formed from silicon oxide.

22. The method of claim 15 wherein the insulating layer is formed from silicon nitride.

\* \* \* \* \*